(12) United States Patent
Johnsgard et al.

(10) Patent No.: US 6,342,691 B1
(45) Date of Patent: Jan. 29, 2002

(54) APPARATUS AND METHOD FOR THERMAL PROCESSING OF SEMICONDUCTOR SUBSTRATES

(75) Inventors: Kristian E. Johnsgard, Los Gatos; Jean-François Daviet, Fremont; James A. Givens, Livermore; Stephen E. Savas, Alameda; Brad S. Mattson, Los Gatos; Ashur J. Atanos, San Jose, all of CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/439,833

(22) Filed: Nov. 12, 1999

(51) Int. Cl.[7] .................................................. F27B 5/14
(52) U.S. Cl. ........................ 219/390; 219/405; 219/411; 392/416; 118/724; 118/50.1
(58) Field of Search ................................ 219/390, 405, 219/411; 118/724, 725, 50.1; 392/416, 418

(56) References Cited

U.S. PATENT DOCUMENTS

| | | | |
|---|---|---|---|
| 4,481,406 A | 11/1984 | Muka | 219/411 |
| 4,496,609 A | 1/1985 | McNeilly et al. | 427/55 |
| 4,641,603 A | 2/1987 | Miyazaki et al. | 118/724 |
| 4,672,915 A | * 6/1987 | Jenkins | 118/124 |
| 4,770,630 A | * 9/1988 | Akimoto et al. | 432/121 |
| 4,794,217 A | 12/1988 | Quan et al. | 437/247 |
| 4,857,689 A | 8/1989 | Lee | 219/10.71 |
| 4,914,276 A | 4/1990 | Blair | 219/390 |
| 5,001,327 A | 3/1991 | Hirasawa et al. | 219/390 |
| 5,011,794 A | 4/1991 | Grim et al. | 437/247 |
| 5,119,761 A | 6/1992 | Nakata | 118/725 |
| 5,207,573 A | 5/1993 | Miyagi et al. | 432/152 |
| 5,252,807 A | 10/1993 | Chizinsky | 219/390 |
| 5,387,557 A | 2/1995 | Takagi | 437/247 |
| 5,462,603 A | * 10/1995 | Murakami | 118/719 |
| 5,520,742 A | 5/1996 | Ohkase | 118/724 |

(List continued on next page.)

*Primary Examiner*—Teresa Walberg
*Assistant Examiner*—Shawntina Fuqua
(74) *Attorney, Agent, or Firm*—Wilson Sonsini Goodrich & Rosati

(57) ABSTRACT

A semiconductor substrate processing system and method of using a stable heating source with a large thermal mass relative to conventional lamp heating systems. The system dimensions and processing parameters are selected to provide a substantial heat flux to the substrate while reducing the potential of heat loss to the surrounding environment, particularly from the edges of the heat source and substrate. Aspects of the present invention include a dual resistive heater system comprising a base or primary heater, surrounded by a peripheral or edge heater. The impedance of the edge heater may be substantially matched to that of the primary heater such that a single power supply may be used to supply power to both heaters. Both resistive heaters deliver heat to a heated block, and the heaters and heated block are substantially enclosed within an insulated cavity. The walls of the insulated cavity may include multiple layers of insulation, and these layers may be substantially concentrically arranged. The innermost layers may comprise silicon carbide coated graphite; the outer layers may comprise opaque quartz. An embodiment of the invention includes a vacuum spool having a large conduction pathway for exhausting gases from the region of the chamber containing the resistive heaters, and a small conduction pathway for removing gases from other regions of the chamber. Temperature measurement sensors include thermocouples and optical pyrometers, with the advantage that a thermocouple may be used to calibrate an optical pyrometer in situ. An insulating shutter may be used to insulate the port through which substrates are inserted into the insulated and heated cavity. Support posts and gas injectors may include ports for optical pyrometers.

35 Claims, 8 Drawing Sheets

U.S. PATENT DOCUMENTS

| | | |
|---|---|---|
| 5,536,918 A | 7/1996 | Ohkase et al. ............... 219/390 |
| 5,651,827 A | 7/1997 | Aoyama et al. ............ 118/725 |
| 5,680,502 A | 10/1997 | Kim .......................... 392/416 |
| 5,695,564 A | 12/1997 | Imahashi .................... 118/719 |
| 5,772,770 A * | 6/1998 | Suda et al. ................. 118/719 |
| 5,958,140 A * | 9/1999 | Arami et al. ............... 118/725 |
| 5,958,510 A | 9/1999 | Sivaramakrishnam et al. ....................... 427/255.6 |
| 6,002,109 A * | 12/1999 | Johnsgard et al. .......... 219/390 |
| 6,046,439 A | 4/2000 | Johnsgard et al. ....... 219/444.1 |
| 6,133,550 A | 10/2000 | Griffiths et al. ............. 219/403 |
| 6,198,074 B1 | 3/2001 | Savas ........................ 219/390 |

* cited by examiner

| Parameter | Step 1 | Step 2 | Step3 |
|---|---|---|---|
| Time | 3 seconds | 30 to 40 seconds | 4 seconds |
| Pressure | 2.3 Torr | 10,35, or 50 Torr, depending on desired application | 2.3 Torr |
| Purge gas C1 | nitrogen 500 sccm | nitrogen 500sccm | nitrogen 500sccm |
| Process gas C2 | nitrogen 500 sccm | nitrogen 2,000 sccm | nitrogen 500 sccm |
| Temperature of heated block | 650 or 1000°C, depending on application | 650 or 1000°C, depending on application | 650 or 1000°C, depending on application |

FIG. 12

APPARATUS AND METHOD FOR THERMAL PROCESSING OF SEMICONDUCTOR SUBSTRATES

BACKGROUND

Diffusion furnaces have been widely used for thermal processing of semiconductor device materials (such as semiconductor wafers or other semiconductor substrates). The furnaces typically have a large thermal mass that provides a relatively uniform and stable temperature for processing. However, in order to achieve uniform results, it is necessary for the conditions in the furnace to reach thermal equilibrium after a batch of wafers is inserted into the furnace. Therefore, the heating time for wafers in a diffusion furnace is relatively long, typically exceeding ten minutes.

As integrated circuit dimensions have decreased, shorter thermal processing steps for some processes, such as rapid thermal anneal, are desirable to reduce the lateral diffusion of dopants and the associated broadening of feature dimensions. Thermal process duration may also be limited to reduce forward diffusion so the threshold voltage of the MOS transistors does not shift. As a result, the longer processing times inherent in conventional diffusion furnaces have become undesirable for many processes. In addition, increasingly stringent requirements for process control and repeatability have made batch processing undesirable for many applications. As an alternative to diffusion furnaces, single wafer rapid thermal processing (RTP) systems have been developed for rapidly heating and cooling wafers. Most RTP systems use high intensity lamps (usually tungsten-halogen lamps or arc lamps) to selectively heat a wafer within a cold wall, clear quartz furnace. Since the lamps have very low thermal mass, the wafer can be heated rapidly. Rapid wafer cooling is also easily achieved since the heat source may be turned off instantly without requiring a slow temperature ramp down. Lamp heating of the wafer minimizes the thermal mass effects of the process chamber and allows rapid real-time control over the wafer temperature. While single wafer, lamp-based RTP reactors provide enhanced process control, their throughput is substantially less than batch furnace systems.

While lamp-based RTP systems allow rapid heating and cooling, it is difficult to achieve repeatable, uniform wafer processing temperatures using them, particularly for larger wafers (200 mm and greater). The temperature uniformity is sensitive to the uniformity of the optical energy absorption as well as the radiative and convective heat losses of the wafer. Wafer temperature nonuniformities usually appear near wafer edges because radiative heat losses are greatest at the edges. During heating the wafer edges may, at times, be several degrees (or even tens of degrees) cooler than the center of the wafer. At high temperatures, generally greater than nine hundred degrees Celsius (900° C.), this nonuniformity may produce crystal slip lines on the wafer (particularly near the edge). To minimize the formation of slip lines, insulating rings are often placed around the perimeter of the wafer to shield the wafer from the cold chamber walls. Otherwise, wafer temperature non-uniformity may lead to non-uniform material properties such as alloy content, grain size, and dopant concentration. These non-uniform material properties may degrade the circuitry and decrease yield even at low temperatures (generally less than 900° C.). For instance, temperature uniformity is critical to the formation of titanium silicide by post deposition annealing. The proper alloy is formed only within a range of temperatures of several degrees. In fact, the uniformity of the sheet resistance of the resulting titanium silicide is regarded as a standard measure for evaluating temperature uniformity in RTP systems because it so sensitively reflects the precise temperature at which the silicide was formed.

Wafer temperature levels and uniformity must therefore be carefully monitored and controlled in lamp-based RTP systems. Optical pyrometry is typically used due to its noninvasive nature and relatively fast measurement speed which are critical in controlling the rapid heating and cooling in RTP. However, accurate temperature measurement of wafer temperature using optical pyrometry depends upon the accurate measurement of the intensity of radiation emitted from the wafer and upon the wafers radiation emitting characteristics or emissivity. Emissivity is typically wafer-dependent and depends on a range of parameters, including temperature, chamber reflectivity, the wafer material (including dopant concentration), surface roughness, and surface layers (including the type and thickness of sub-layers), and will change dynamically during processing as layers grow on the surface of the wafer. In addition, radiation from heat sources, particularly lamps, reflect off the wafer surface and interfere with optical pyrometry. This reflected radiation erroneously augments the measured intensity of radiation emitted from the wafer surface and results in inaccurate wafer temperature measurement. It is therefore preferable in the interest of reduced system complexity and cost of processing in an RTP system to have means for controlling the wafer temperature other than one requiring it to be accurately measured such as is required with the lamp-based systems. It is desirable from the standpoint of cost per wafer processed (avoidance of expensive wafer emissivity measurement apparatus) to be able to control the process by keeping the wafer temperature within the desired processing range without directly measuring the wafer temperature.

In order to overcome the disadvantages of lamp heated RTP systems, a few systems have been proposed which use a resistively heated plate. Such heated plates provide a relatively large thermal mass with a stable temperature. The inherent temperature uniformity of wafer heating by a plate (whose lateral thermal conductivity is high compared with that of the wafer) is superior to that of a wafer by itself, such as is characteristic of the common lamp-based RTP systems. Therefore, by employing such a plate or susceptor for wafer heating, where the temperature uniformity of a wafer on the block is measured and is made to be well within specifications prior to usage for device wafer processing, the wafer temperature can be made to be highly uniform during processing.

While heated plate rapid thermal processors provide a stable temperature on the heated plate that may be measured using a thermocouple, problems may be encountered with wafer temperature nonuniformities. Wafers may be heated by placing them near the heated plate rather than on the plate. In such systems, the edges of the wafer may have large heat losses which lead to nonuniformities as in lamp heated RTP systems. Even when a wafer is placed in contact with a heated plate, there may be nonuniformities. The heated plate itself may have large edge losses, because: 1) the corners and edges of the plate may radiate across a wider range of angles into the chamber; 2) vertical chimney effects may cause larger convective heat losses at the edges of the heated plate; and 3) the edges of the heated plate may be closer to cold chamber walls. These edge losses on the plate may, in turn, cause temperature nonuniformities in a wafer placed on the plate.

In addition, heat loss and temperature uniformity across the wafer surface varies with temperature and pressure.

Conductive heat transfer between two objects (such as the wafer and the cold chamber wall) is proportional to the temperature difference between the objects and radiative heat transfer is proportional to the difference of the temperatures raised to the fourth power ($T_1^4 - T_2^4$). Thus, the difference in heat losses across the wafer surface (resulting in wafer temperature differences) will increase at higher processing temperatures. In addition, the pressure in the chamber may affect the wafer temperature profile since heat transfer at low pressures is predominantly by radiation, while heat transfer at higher pressures involves a combination of radiation, conduction and convection.

Another important aspect of a thermal processing system is its ability to provide the same wafer temperature to a cassette of wafers regardless of the thicknesses and types of layers on the wafer backside. During processing wafers for the same process may have varying backside coating(s) most commonly of silicon, silicon dioxide or silicon nitride. These coatings will tend to cause variation in the emissivity of the wafer backside which will affect the heating rate of the wafer and its equilibrium temperature when radiation is an important part of the heat flow in the system. It is not uncommon for wafers with the same process needed on the front side to have different backside coatings or none at all. Thus, in order for a system to be commercially viable it must process such wafers in such a manner as to yield effectively the same wafer temperature regardless of the backside coatings. When the front of the wafer is exposed to a substantially cooler top or walls in a heated plate system, the wafer temperature may vary significantly with the backside emissivity whenever the radiative heat transfer is a significant part of the heat flow from the heater to the wafer. Were it possible to have the temperature of the wall nearer to that of the wafer there would be less dependence of the wafer temperature on the emissivity of the wafer backside.

Conventional heated plate processing systems also tend to be energy inefficient. The heated plate is maintained at a high temperature with constant conductive, convective and radiative losses to the cold chamber walls. While conductive and convective losses may be reduced at lower pressures, this also inhibits the heat transfer to the wafer. At low pressures where heating is primarily radiative, the wafer may be significantly cooler than the heated plate particularly when proximity heating is used. This makes the wafer temperature difficult to control. Further, at low pressures where radiation is the primary mechanism for heat transfer, the variance in wafer temperature uniformity across temperature ranges may be greater because heat transfer by radiation is proportional to the difference between surface temperatures raised to the fourth power ($T_1^4 - T_2^4$). Thus, decreasing pressure to increase energy efficiency may make the wafer temperature and uniformity more difficult to control.

SUMMARY OF THE INVENTION

One aspect of the present invention provides a semiconductor substrate processing system and thermal processing method. The processing system comprises a base (or primary) resistive heater and an edge (or peripheral) resistive heater for heating one or more blocks having a large thermal mass, and insulating walls surrounding the heaters and the block(s) for insulating a thermal processing region. The system dimensions and processing parameters are preferably selected to provide a substantial heat flux to the substrate while reducing the potential for heat loss to the surrounding environment, particularly from the edges of the heated block and the substrate. The heat source (comprising the resistive heaters and the heated block) provides a wafer temperature uniformity profile that is substantially constant across a large temperature range at low chamber pressures.

In one aspect of the present invention, one or more semiconductor substrates may be simultaneously transferred from a storage cassette into a load lock; from the load lock into a processing chamber by passing the substrates through a port in a wall of the processing chamber; and thence onto support pins capable of raising and lowering the substrate(s) relative to the heated block. The heated block receives heat from dual resistive heaters comprising a primary or base resistive heater located below the heated block, and a peripheral or edge heater positioned substantially around the edges of the base heater. In one embodiment of the invention, the heaters may be fabricated from silicon carbide coated graphite. Temperature measuring sensors such as thermocouples and optical pyrometers may be inserted into or placed adjacent the heated block; in one aspect of the present invention, a thermocouple is arranged such that its tip opposes that of an optical pyrometer. The thermocouple may be used to calibrate the optical pyrometer.

Preferably, the heated block and the resistive heaters are substantially enclosed within insulating walls that form the thermally insulated cavity. It is an advantage of one aspect of the present invention that the insulated cavity be formed by multiple layers of these insulating walls, and the layers may be arranged in a substantially concentric manner. The innermost insulating walls on the top, bottom, and sides of the insulated cavity may comprise silicon carbide coated graphite, and the outer walls may comprise opaque quartz. In one aspect of the invention, there may be three layers of insulation at the top and bottom of the cavity, and two layers of insulation around the sides, thus forming a compact design. Insulating layers that form the bottom of the insulated cavity may be supported by posts that also serve to space apart the bottom insulating walls from the bottom chamber wall and the heater block. An insulating shutter may be moved adjacent to the entrance port to reduce heat loss from the thermally insulated cavity when substrates are not being transferred into and out of the chamber.

The dual heater system and multiple layers of insulation provide a high-level of thermal uniformity within the chamber, and this uniformity may be maintained across a wide range of temperatures.

An additional aspect of the present invention includes sleeves that surround the elevational pins which raise and lower the substrate relative to the heated block. The sleeves help to isolate the regions of the chamber containing the resistive heaters from the thermal cavity in which the substrates are processed, and serve to substantially prevent gases containing trace metals in the vapor phase (originating from the resistive heaters) from contaminating the substrates. The sleeves may comprise clear quartz, opaque quartz, silicon carbide, or some other ceramic.

An additional aspect of the present invention includes a vacuum spool or baffle inserted within the foreline of the exhaust system. The spool has a large conductance pathway for exhausting the region of the processing chamber containing the heaters, and a small conductance pathway for exhausting other regions of the chamber not containing heaters. Furthermore, the spool assists in protecting sensitive components of the exhaust system, such as sealing o-rings, by lowering the temperature of the exhaust gases before they enter the vacuum pump(s)l The spool also acts to reduce heat loss from the chamber.

Aspects of the present invention include methods of using the thermal processing system. One of the critical attributes of these methods is the pressure at which the system is operated, since pressure helps to determine the rate of the temperature ramp. A single processing step may be employed if the load lock pressure is the same as the processing pressure; a three step process may be used if the load lock pressure is different from the processing pressure. Typical load lock pressures for steps 1 and 3 are about 2 to 3 Torr, but may be as high as 100 Torr; exemplary processing pressures in step 2 range from 10 to 50 Torr, and any range subsumed therein.

BRIEF DESCRIPTION OF THE DRAWINGS

These and other features and advantages of the present invention will become more apparent to those skilled in the art from the following detailed description in conjunction with the appended drawings in which:

FIG. 12 is an exemplary three-step process.

DETAILED DESCRIPTION

Figure 1:
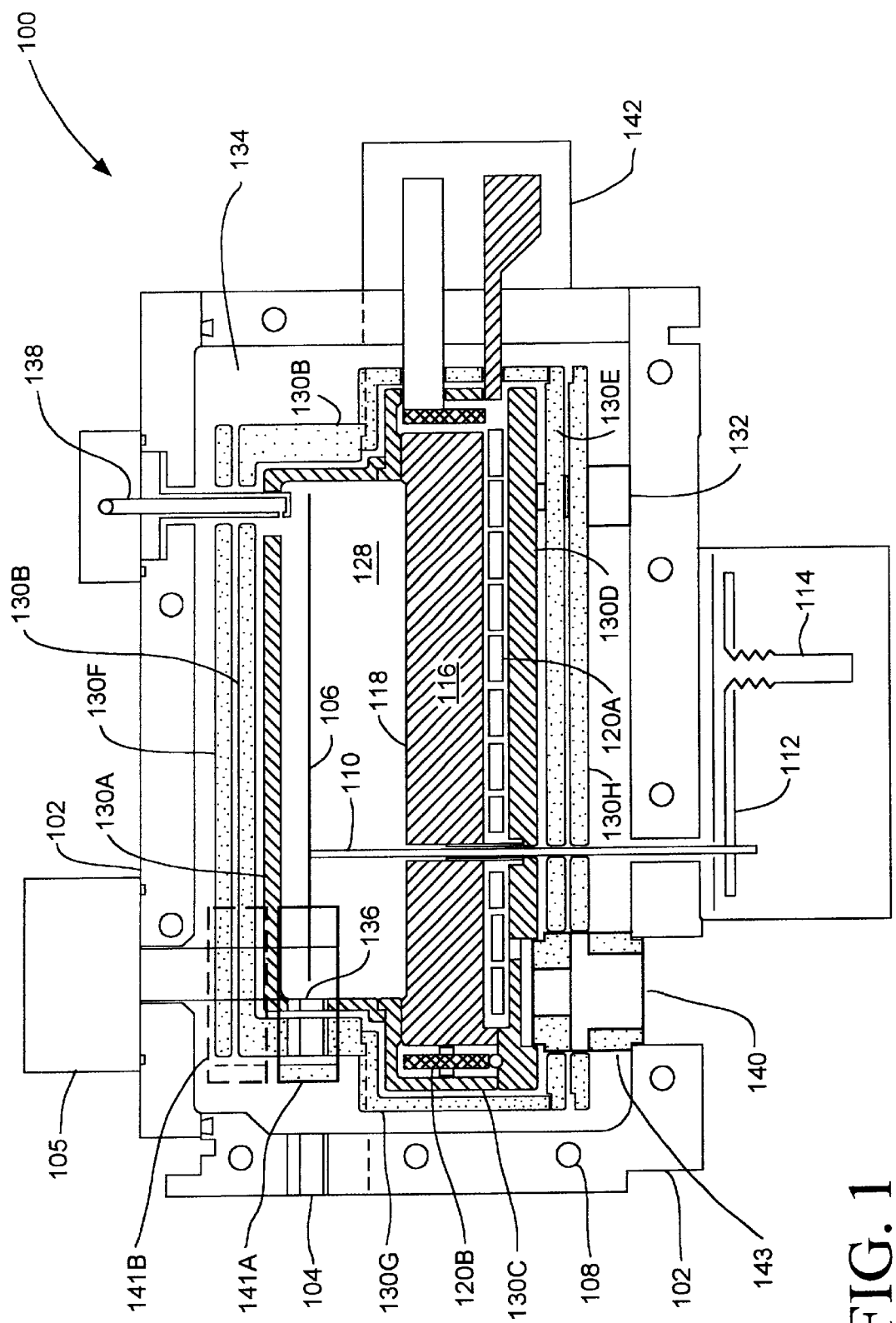
FIG. 1 is a side cross-sectional view of a thermal processing chamber according to an embodiment of the present invention.

As a result of the problems associated with conventional heated plate rapid thermal processors, they have not been widely adopted in the industry as a viable alternative to lamp heated RTP systems. Currently, the RTP market is dominated by lamp based systems and despite the many problems associated with such systems, they have been widely accepted over proposed heated plate approaches. Despite the potential that heated plate approaches offer for a stable and repeatable heat source, it is believed that problems with energy efficiency, uniformity, temperature and heating rate control, and the deployment of fragile, noncontaminating resistive heaters have made such systems unsuccessful in the marketplace.

What is needed is a system and method for rapid thermal processing with a stable and repeatable wafer-heating surface that provides a high level of wafer temperature uniformity across a wide range of temperatures (400° C. to 1200° C.). Preferably, the heating surface would be maintained at a high temperature without necessitating rapid heating and cooling of the heat source for the wafer heater. Preferably, such heat source could give such flexibility of control over temperature uniformity assured irrespective of the processing temperature. In addition, such a system would preferably be energy efficient while providing accurate wafer temperature control that is substantially independent of variances in wafer backside emissivity and would allow a cold walled chamber to be used. Preferably such a system would also provide substantially improved throughput over conventional single wafer RTP systems while maintaining a high level of process temperature control and wafer temperature uniformity. Such a system would also preferably provide a compact heating source that is not significantly larger than the wafers being heated.

What is also needed is a system for thermal processing of a wafer using a heater plate (whose upper surface provides heat to the wafer) with either a large and thermally stable mass, or with a rapid-ramp, high power heater (which allows the rate of heating to be rapidly adjusted) to replenish heat lost by the plate to the wafer to achieve desired stable plate temperature. Preferably such a system would allow a wafer to be heated at a rapid rate until a desired temperature is achieved and then allow the rate of wafer heating to be quickly adjusted to maintain the temperature at a relatively constant level. In addition, such a system would preferably allow thermal processing of wafers with a desired temperature profile, uniformity and throughput competitive with conventional lamp RTP systems.

Requirements for future wafer processes will probably include temperature uniformity within a few degrees C. for every wafer. These processes are also likely to require temperature stability for wafers within a cassette or from one cassette to succeeding cassettes of about one degree C. This will mean that processing systems must have wafer temperature independent of backside emissivity to within a few degrees C. Reduction of cost for wafer processing will also require excellent heat efficiency to avoid energy waste and excessive cooling system cost.

Above a certain temperature (about 900° C.) in some systems there may be increased sensitivity of a wafer's temperature to its backside emissivity. This may be due, in part, to a heat shield/hood above the wafer that is in radiative equilibrium at a temperature well below that of the heater plate or wafer (when it is at process temperature). Therefore, the wafer "sees" a large surface area which is much colder than it is and consequently its temperature is dependent on the emissivity of its backside. This will increasingly found to be unacceptable for reasons of efficiency of the use of RTP machines within the factory of the future—different recipes for wafers with different processing history complicates the operation of the factory using such RTP systems.

For the range of processes when including those at higher temperatures there will also be greater difficulty with wafer temperature uniformity due to the temperature non-uniformity's of the heater plate. This non-uniformity is due to the varying relative importance of radiative and conductive cooling of the edge of the plate. This effect cannot easily be remedied over the large temperature range required for the full set of wafer processes while using a single heating element.

When processing wafers rapidly at higher temperatures it happens that the wafers carry significant heat away from the wafer heating plate as they are removed from the hot plate. This continues to be true even when that plate has many times the mass and heat capacity of the wafer. In this case it is necessary for the control system which provides power to heat the plate to rapidly and accurately sense the temperature change and increase power to maintain its temperature at the proper level. Even so, the wafer temperature is also influenced by the temperature of the hood which provides heat shielding above the wafer. As the cold wafer is introduced into the heated cavity formed by the heater plate and the hood/heat shield it reduces the amount of power radiating to the hood by blocking/absorbing the radiation coming from the plate. This drops the hood temperature until it finds its substantially radiative equilibrium temperature. The colder hood then causes the temperature of succeeding wafers to be cooler, despite the fact that the heater plate temperature is held adequately constant. When wafers are processed with a high duty cycle (so as to increase the efficiency of use of the machine) this problem worsens as the process (and plate) temperature increases, causing an unacceptable decrease in wafer temperature from the first wafer of a batch to the later wafers.

When using such a hot plate system because of the rapid temperature changes of the plate when loading cold wafers it is necessary to measure the plate temperature with very fast time response in order to rapidly respond to and compensate for that temperature change. When using thermocouples in such a system (as have been used traditionally) it is difficult to get such fast time response while at the same time protecting the wafer environment from contamination by metal from the thermocouple. Semiconductor wafers are exceedingly sensitive to such metals and may be poisoned by as little as $10^{-5}$ of a monolayer over the wafer surface. Such metallic elements migrate rapidly in such a hot system where their vapor pressure is not zero and therefore must be vacuum-isolated from the wafer environment. This vacuum isolation must be accomplished by some material such as a ceramic protective layer which unavoidably reduces the rapidity of response of the thermocouple to the plate temperature change. Such rapid temperature sensing can be done by a pyrometer but such pyrometers are prone to drift in their readings due to surface coating, contamination or other material changes. This drift in temperature readings is unacceptable for semiconductor manufacturing where wafer temperature must not vary over time or from batch to batch.

Aspects of the present invention provide thermal processing systems and methods which address many of the problems associated with conventional hot-plate based RTP systems. The following applications are intended to supplement the disclosure hereof and describe thermal processing related configurations, features and processes that may be used in conjunction with aspects of the present invention: U.S. patent application Ser. No. 08/499,986, titled "System and Method for Thermal Processing of a Semiconductor Substrate," filed Jul. 10, 1995, by Kristian E. Johnsgard, Brad S. Mattson, James McDiarmid and Vladimir J. Zeitlin, U.S. patent application Ser. No. 08/876,788, titled "System and Method for Thermal Processing of a Semiconductor Substrate," filed Jun. 16, 1997, by Kristian E. Johnsgard, Brad S. Mattson, James McDiarmid and Vladimir J. Zeitlin, U.S. patent application Ser. No. 08/923,661, titled "System and Method for Rapid Thermal Processing," filed Sep. 4, 1997, by Stephen E. Savas, U.S. Provisional Patent Application Ser. No. 60/067,299, titled "Systems and Methods for Low Contamination, High Throughput Handling of Workpieces for Vacuum Processing," filed Nov. 28, 1997, by Fred Tabrizi, Barry Kitazumi, David A. Barker, David A. Setton, Leszek Niewmierzycki and Michael J. Kulman, U.S. Provisional Patent Application Ser. No. 60/092,563, titled "A Model Based Method for Wafer Temperature Control in a Thermal Processing System for Semiconductor Manufacturing," filed Jul. 13, 1998, by Stephen E. Savas, Martin L. Hammond, Robert Mueller and Jean-Francois Daviet, U.S. Provisional Patent Application Ser. No. 60/092,759, titled "Cleaning Process for Rapid Thermal Processing System," filed Jul.13, 1998, by Stephen E. Savas, Martin L. Hammond and Jean-Francois Daviet, and U.S. Patent Application Ser. No. 09/140,614, titled "Method and Apparatus for Thermal Processing of Semiconductor Substrates," filed Aug. 26, 1998, by Stewart K. Griffiths, Robert H. Nilson, Brad S. Mattson and Stephen E. Savas, each of which is hereby incorporated herein by reference in its entirety.

One aspect of the present invention provides a semiconductor substrate processing system and method using a stable heating source with a hot-plate-based wafer heating system. The system's dimensions and processing parameters are preferably selected to provide a substantial heat flux to the wafer while minimizing heat loss to the surrounding environment (particularly from the edges of the hot plate, heat source and wafer(s)). The hot plate is mostly radiatively heated by resistively heated elements provided with current from an external power supply controlled by a control system. The hot plate provides a wafer temperature uniformity profile that has a low variance across temperature ranges at low to moderate pressures. This may be accomplished in one embodiment of the invention by providing insulation covering the hot plate, except for openings shaped to receive semiconductor wafer(s), including at its/their edges and corners. This insulation is by a noncontaminating, partially transmissive insulating material which is spaced at least some small distance from the plate. Thus the entire plate is substantially enclosed within an insulated cavity within which the wafer(s) is/are heated by the plate. A region of thermal isolation is preferably provided between the hot plate and the insulating material as well as between the insulating material and the chamber wall. Heat transfer across the isolation regions is primarily by radiation and to a somewhat lesser degree by conduction or convection, while heat transfer through the insulating material is by conduction and to some extent radiation diffusion. The wafer(s) is/are placed on or near the hot plate within the vacuum cavity for heating by conduction and radiation.

It is an advantage of this aspect of the present invention that the reactor heating profile may be adjusted to provide a high level of processing uniformity of the wafer across a wide range of temperatures. To accomplish this a very even and consistent temperature uniformity profile of the wafer must be achievable for a wide range of temperatures. This can be done with a two (or more) zone heater for the plate providing flexibility in the spatial distribution of heat deposition in the plate which is required to offset the variation with temperature in the spatial dependence of heat losses from the plate. The proper temperature profile of the heater plate (which may be achieved at any temperature in the range for processes) then causes the variation of the temperature across the wafer(s) to be reduced to acceptable levels for any process temperature. In general, as the processing temperature changes the relative power levels of the two or more heaters for the hot plate will have to change in order that the optimal temperature uniformity be achieved on the wafers. This is due to the fact that the two or more heaters must balance the heat losses from various parts of the hot plate whose relative values change as the desired hot plate temperature changes.

In one possible embodiment the two (or more) zone heater includes a radiant base heater, also called the principal heater, on the opposite side of the plate from the wafer and one or more supplemental heaters which surround the edge of the plate. The base heater may have a spatially non-uniform radiant output so as to offset to some degree the greater heat loss from the plate at its edges. However, the edge heater(s) are required to compensate for the variation in edge heat losses by the plate which may be variable along the edge. This variation along the edge will, in general, be a function of temperature since the relative importance of radiative and conductive losses varies with temperature. The variation along the edge will also be a function of the shape of the heater plate which may accommodate more than one wafer at a time. In the case of a simply shaped heater plate for a single wafer such as a disc shaped plate it may be possible to use a single edge heater. It is also possible to employ an edge heater with a heat output which varies along its length so as to compensate for the different rate of edge losses at different places along the edge of the plate. In this case the use of a single edge heater may suffice for a heater plate which can accommodate more than one wafer at a time. Such base and edge heaters may be made of graphite or silicon carbide or other clean resistive materials which are stable with respect to position when heated to high temperature.

Such supplemental heaters for various zones of the hot plate preferably are able to be controlled independently of the primary heater so that they may be adjusted with minimal effect on the central temperature of the hot plate. This simplifies the control of the temperature since it reduces the complexity of the interaction of the heater control systems mediated by the conduction of heat through the hot plate. In the case where such supplemental heaters are disposed in the zone(s) near the wafer's edge for the purpose of raising the edge temperature to approximately that of the center of the hot plate, and when the principal heater in its heating pattern in some fair degree compensates for the higher heat losses at the edge of the hot plate, there is likely to be relatively less impact on the central temperature from such power input from supplemental heaters. In part this will be due to the lower levels of power being used for the supplemental heaters compared with the principal heater.

In the event there is not too substantial an effect of the supplemental heater(s) on the hot plate central temperature it is possible to simplify the type of control system used for the hot plate temperature. In this case it is possible to have temperature measurement sensors disposed near the center and edge region(s) of the hot plate and have a look-up-table based control algorithm. This could yield the desired hot plate temperature profile by simply having base and edge heaters provide enough heat to maintain pre-specified set point temperatures at the different sensor locations. These pre-specified temperatures for the various zones might be found in advance for any specific process temperature by determining which combination of temperature readings of the different sensors produces the optimal wafer temperature uniformity. If there were to be substantial interaction between the central temperature and the edge heater power the control system would be more likely to cause an oscillatory behavior of the hot plate temperature rather than the steady temperature desired. Having achieved the desired hot plate temperature profile specified for a given wafer processing temperature it would then result in optimally uniform wafer temperature during processing.

If it is desired to further reduce the amount of electric power used in such thermal processing of wafers while making easier the achievement of acceptably uniform temperature for the very stringent future requirements of semiconductor devices one may utilize multiple heat shield layers in the structures which cover the wafers. Such covers or hoods might be made of opaque material so that they reduce the amount of radiation from the wafer which reaches the walls. The use of multiple layers results in reduced radiant heat loss to the walls and therefore a reduction in the amount of power needed to process the wafers. This lowers cost of operation and the cost of replacement parts since the lifetime of such heater parts is inversely related to their average temperature of operation and higher power output requires higher heater surface temperature. The use of multiple layers also aids in achieving the desired wafer temperature uniformity since it provides an environment for the wafer which is closer to its own temperature and hence which absorbs less net power from the front side of the wafer. The absorption of less net power from the front of the wafer almost always means that the variation in the power loss from different parts of the wafer will be less, resulting in a more uniform wafer temperature. Another advantage of multiple layer heat shields is that the higher surface temperature of the innermost shield will reduce the total rate of net heat loss from the front surface of the wafer and thereby reduce the variation of wafer temperature caused by variations in the emissivity of the backside of the wafer.

This method of heating the heater plate allows a titanium silicide annealing process to be performed with virtually no added non-uniformity in the resulting film resistivity which is a significant improvement over typical lamp systems, even those with multiple, independently controlled heating zones.

It is a further advantage that compact radiant heat source(s) for the plate may be relatively close to cold chamber walls without substantial temperature non-uniformities. Toward this end there may be heat shield(s) disposed between the heaters and the cold walls of the isolation chamber to reduce the radiant heat loss of the heaters in directions away from the heater plate. These shields may be made from clean materials having very low metal content and having high stability at such elevated temperatures. Because of such reduced radiative losses for the heaters due to shields the distance from the heaters to the cold walls may be reduced while still not exceeding some limiting power density of heat absorbed at the walls. This provides a smaller size (and hence cost and footprint) for the reactor without diminishing uniformity and allows the chamber to be easily purged to control pressure. It is a further advantage of this aspect of the present invention that energy efficiency is substantially improved due to the smaller size of the heated region without substantially increasing variance in wafer temperature uniformity across temperature ranges. It is yet another advantage that the cost of the system is reduced because of the reduced cost of the smaller size parts including heater plate and heat shields which are increasingly expensive to fabricate and fragile as they increase in size.

A further aspect of the present invention provides a system and method for rapidly adjusting the rate of heating provided by a heat source without substantially changing the temperature of the heat source. This may be accomplished in one embodiment of the invention by adjusting the processing pressure to adjust the heating rate. Preferably, a wafer is initially heated at a pressure that allows conductive and radiative heat transfer. As a desired processing temperature is approached, the pressure may be lowered to reduce the amount of conductive heat transfer and thereby reduce the rate of heating. In particular, it is desirable to vary the pressure in this manner across a range of low pressures where a small change in pressure has a large effect on the rate of heating. Preferably, multiple pressures are used to provide a rapid heat ramp up to a processing temperature that is then maintained at a relatively constant level.

In one embodiment of this invention the hot plate has a large thermal mass relative to the wafer and is made of a good thermal conductor material. In this case the temperature uniformity of the wafer is more easily achieved since the thermal conductivity of the hot plate then allows it to rapidly redistribute the heat applied to it. It is also an advantage of this embodiment that the high heat capacity of the hot plate can allow it to more easily and stably remain at constant temperature such as is required for efficient semiconductor processing. It is a further advantage of this aspect of the present invention that rapid thermal processing may be carried out using a stable heating source since the fluctuation in requisite heating rate for the hot plate may be reduced due to the thermal ballasting effect. This is most decidedly not the case for the lamp-based RTP systems which do not use such a hot plate.

Temperature variations of the hot plate are mitigated due to the large thermal capacity of the hot plate (or heated block) compared to the smaller heat capacity of the wafers being processed. Nonetheless, conventional methods of temperature control use only the heated block temperature to regulate how much heat should be delivered to successive wafers introduced to the chamber, and these wafers may, as a consequence, experience an unacceptably large variation in temperature. Cold wafers inserted into the system absorb large amounts of heat, and thus reduce the heat flux to the hoods and heat shields located above the substrates that otherwise would have occurred had the wafers been hot. The hoods, heat shields, and insulating walls enclosing the thermal processing cavity (particularly those at the top of the cavity) then experience a large temperature drop as succeeding wafers are processed because most of the wafers' heat originates from the heated block. This effect accumulates, and the temperature of the heat shields above the wafer can drop anywhere from 15 to 90 degrees C. or more as the first 10 to 15 wafers are processed (depending on the initial heated block temperature). The fact that the insulating shields above the wafer are now lower in temperature means that the amount of heat they can re-radiate back to the wafer that is next in line is reduced. Thus, as succeeding wafers are processed in the system, wafer temperature tends to fall despite a constant heated block temperature. Exemplary results are given in the table below.

Precise process temperature control, therefore, requires compensation for this loss of heat from the hoods and upper insulating shields. An embodiment of the present invention calculates a temperature offset to be added to the measured temperature, and this compensated susceptor (heated block) temperature may then be sent to the control system. The compensated temperature varies from wafer to wafer in the same series, and is based only on the change in the temperature of the innermost insulating shield. The offset is such that it causes the hot plate to be raised gradually to a higher temperature (than it otherwise would have been at), and, thus, it provides more heat to the wafer to compensate for the reduced heat being re-radiated from the shield. The magnitude of the temperature offset may be based on the deviation of the innermost hood temperature from its equilibrium value—that is to say, its value in the absence of cycling wafers. The deviation of the hood temperature from its equilibrium value may vary with time, t, and the deviation may be denoted by $\Delta T_{hood}(t)$. The maximum value of this deviation, $\Delta T_{hood,max}$, may be measured before any device processing in the system with a specially instrumented system or diagnostic wafer. The compensated susceptor temperature and the offset from which it is found are then calculated using the following formulas:

$$T_{susceptor,compensated}(t) = \Delta T_{susceptor,offset}(t) + T_{susceptor}(t),$$

where $$\Delta T_{susceptor,offset}(t) = (\Delta T_{wafer,max}/\Delta T_{hood,max})\Delta T_{hood}(t)$$

and where $T_{susceptor}(t)$ is the measured susceptor temperature as a function of time. The compensated susceptor temperature is typically less than the true susceptor temperature because both hood and wafer deviations (instantaneous as well as maximum deviations) are usually negative. As a consequence, the control system will take the compensated temperature and compare it with the set point temperature, finding it to be lower than it would have otherwise based solely on the susceptor temperature. Even if the susceptor is at the set point temperature, the effect of the offset will typically be to make it appear to be lower thus causing the control system to raise the power to the susceptor heater and thereby raise the susceptor temperature. This increased temperature of the susceptor then compensates for the cooler hood and produces a steady controlled wafer temperature despite the variations in the hood temperature. The offset is seen to be a fraction of the maximum temperature deviation of the wafer due to the deviation of that of the hood(s). When the hood temperature deviation reaches its maximum the offset reaches a maximum equal to the maximum wafer temperature deviation.

The maximum deviations of both wafer and hood temperatures may depend on the temperature at which a specific process may be done and the different emissivities of such wafers which are to be processed. Typical examples are shown in the table below. The fraction which is represented by the ratio of the wafer temperature deviation divided by the hood temperature deviation typically used in the calculation is rather small, depending on the relative importance of the radiative and conductive heat transfer to the wafer from the hot plate. The conductive heat transfer from the susceptor to the wafer is often significant, thus making the influence of the susceptor on the wafer stronger than that of the hood.

In fact this above formulation is effectively giving the compensated susceptor temperature as a linear function of the hood and susceptor temperatures. In this linear function the weighting of the susceptor temperature is much greater than that of the hood due to the stronger coupling of the susceptor than the hood to the wafer. Effectively, the compensated susceptor temperature is acting as a surrogate for the wafer temperature because the wafer temperature is, in fact, more influenced by the susceptor than by the hood temperature. It is mathematically plausible that the variation of the wafer temperature due to such relatively small variations in the hood temperature should be a linear function of the variation of the hood temperature.

| Susceptor temperature (degrees C) | Maximum temperature change of wafer (degrees C) | Maximum temperature change of hood (degrees C) |
| --- | --- | --- |
| 500 | 1.5 | 15 |
| 700 | 3 | 25 |
| 1100 | 13 | 90 |

The temperature control system for the hot plate may employ PID-type controllers for each heater utilizing the set point temperature pre-determined for any given process and taking as control inputs the temperatures, including offsets calculated from hood temperature shifts, for the different respective parts (central and edge) of the hot plate. The minimal effect of small incremental heat from the edge heater(s) on the central hot plate temperature permits such a control system wherein there are separate PID controllers for each of the central and edge heaters to accurately control the temperature profile of the hot plate.

Yet another embodiment of the present invention provides a system and method for uniformly heating multiple wafers at a time using a stable hot plate. In one embodiment this capability is provided by using a race-track shaped hot plate and resistive heaters. The resistance of the heaters may be varied across the area corresponding to that of the hot plate to provide approximately uniform and repeatable temperature of the upper surface of the hot plate adjacent to which two or more wafers may placed at the same time. It is an advantage of this aspect of the present invention that wafer throughput is substantially increased without a substantial decrease in process control and uniformity.

An embodiment of the present system may include a flat sheet, graphite resistive heater (which may have been coated with one or more layers of silicon carbide by a CVD process) disposed closely spaced and substantially parallel to and beneath the hot plate. This graphite heater may have a long path for electric current conduction effectively covering the surface area adjacent to the hot plate and have varying cross section along the current path so as to properly shape the heat output to the desired spatial profile. This has the advantage that it reduces the requisite power output from supplemental heaters which may be needed to compensate for the non-uniformity of the hot plate as the processing temperature is varied.

The sensors which are used to measure the temperatures of the various positions of the hot plate in one embodiment of this invention may be optical pyrometers. Such pyrometers may use fiber optic rods inserted into the heated cavity such that the view of each pyrometer is restricted to a small area on the surface of the hot plate. Two or more such sensors may thus give adequate temperature profile information for the hot plate to the control system to permit its temperature profile to be properly and precisely adjusted for any desired process. These fiber optic sensors may be used with sheaths made from quartz or another clean material through which gas may be flowed at a low rate to purge the region of the hot plate which is viewed by the sensor. Such purging will be able to reduce or eliminate the variation in the surface emissivity of the hot plate which might otherwise be caused by condensable materials or reactive gases. Thus, the temperature reading of the pyrometers will be less prone to drift due to the environment of the chamber. Other factors may cause the temperature readings of pyrometers to drift either over time, or with heavy use, and it is necessary to assure that this is not allowed to happen. In order to prevent this in one embodiment of the invention a thermocouple may be employed which senses the temperature of the center of the hot plate during an equilibrium calibration operation. In this operation no wafers are processed but the hot plate is heated to processing temperature range and readings are taken with both pyrometer sensing the hot plate central temperature and the thermocouple. The two readings are compared with each other and must be within a small acceptable limit for discrepancy or the processing is stopped while new pyrometers and/or thermocouples are provided to replace the ones previously used. This assures that processes at given temperature set points are repeatable over extended periods of time. It greatly reduces the problem of pyrometer drift.

Figure 2:
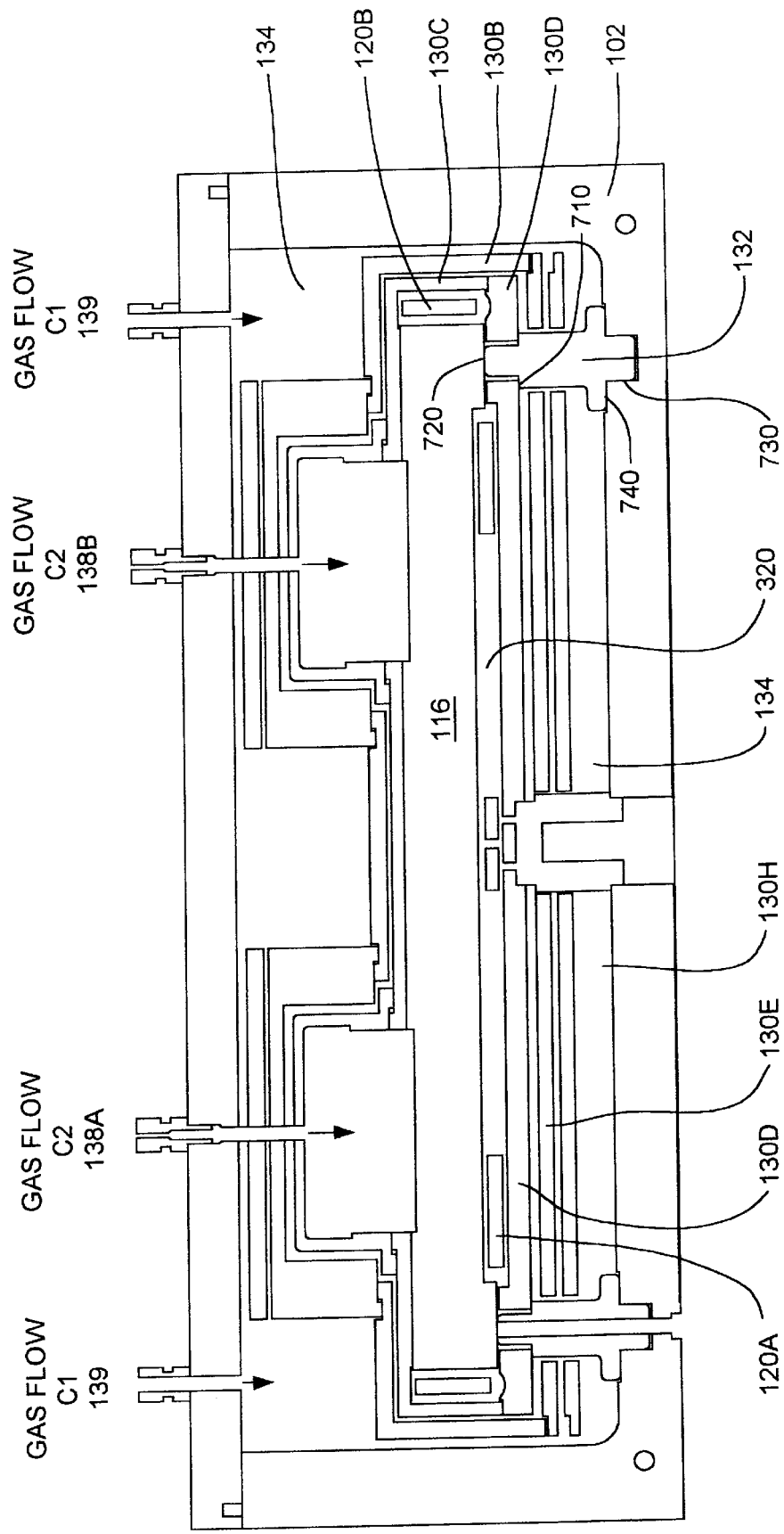
FIG. 2 is a side cross-sectional view of a thermal processing chamber taken at a direction perpendicular to the cross-section of FIG. 1.

FIG. 1 is a side cross-sectional view of a thermal processing chamber, generally indicated at 100, according to an embodiment of the present invention. This embodiment of the present invention is preferably designed for use in conjunction with the Aspen wafer handling system available from Mattson Technology Inc., assignee of record of the present invention. The Aspen system allows two wafers to be handled at a time. According to this embodiment, the chamber has two wafer processing stations, as shown in FIG. 2, where the wafer processing stations are disposed adjacent to each other with the line of their centers perpendicular to the plane of FIG. 1. Aspects of the present invention allow two stable heat sources to be used for uniformly processing two wafers concurrently. One of stable heat sources is the principal or base heater 120A, and the second is the peripheral or edge heater 120B. Of course, a wide variety of processes may be carried out and alternative embodiments may be optimized for processing a single wafer at a time. Techniques described below may also be applied to allow uniform processing of more than two wafers at a time.

Referring to FIG. 1, the chamber walls 102 in the first embodiment form an outer port 104 through which a semiconductor substrate, such as wafer 106, may be introduced into the chamber 100. A conventional load lock mechanism (such as provided by the Aspen system) may be used for inserting and removing wafer 106 through outer port 104. Chamber walls 102 are relatively cold, preferably being maintained at an average temperature less than one hundred degrees C. (100° C.). In the first embodiment, chamber walls 102 are aluminum and are cooled by cooling channels 108. These walls may be plated with a more inert kind of metal such as platinum or nickel in order to prevent chemical reactions with the surface by hot gaseous species. Water (or other cooling medium) may be pumped through cooling channels 108 to cool the aluminum chamber walls 102.

Figure 3:
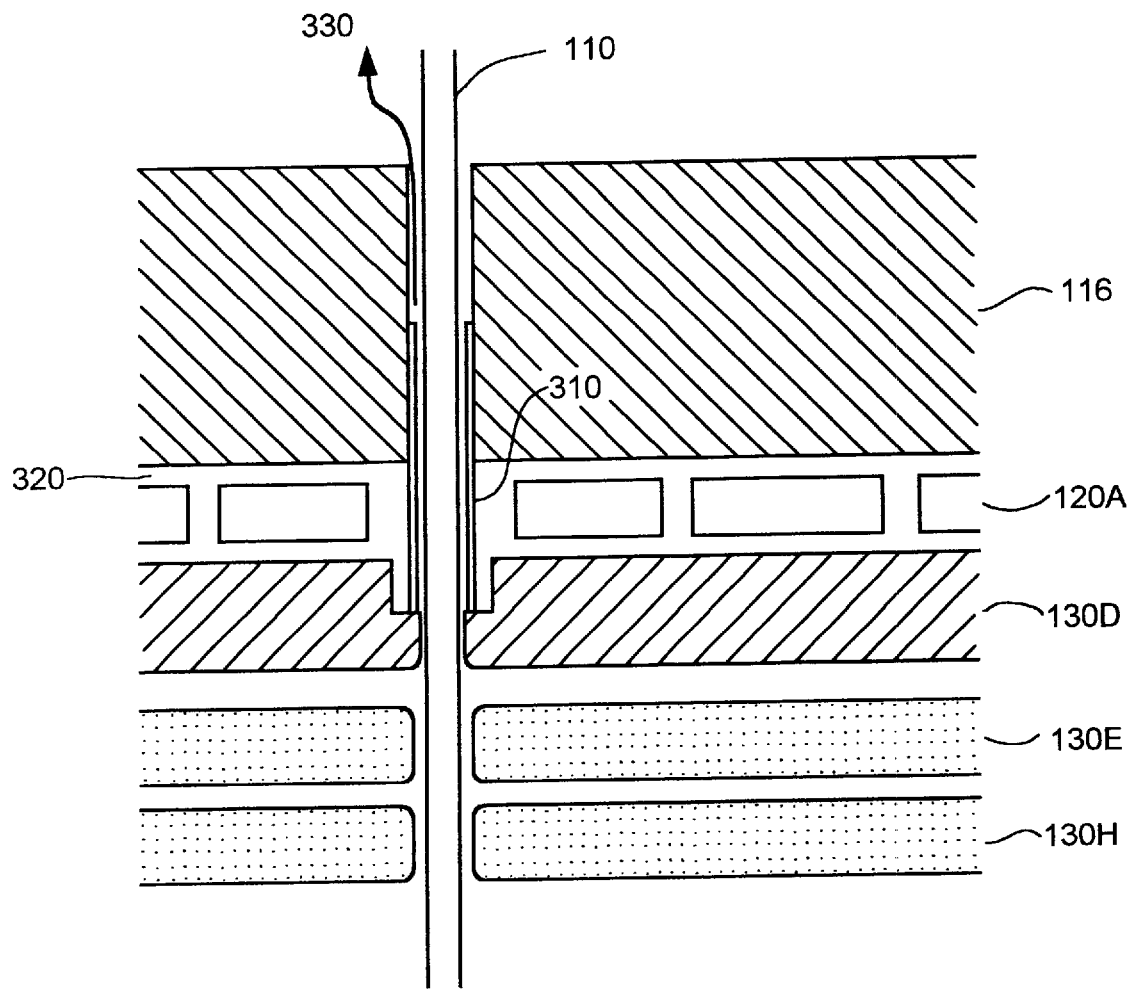
FIG. 3 is a side cross-section of a portion of an exemplary thermal processing chamber showing a sleeve around an elevational pin.

After the wafer is introduced into the chamber, it is placed upon narrow pins 110 which comprise silicon carbide, quartz or ceramic in one embodiment. The pins are mounted on a pin support plate 112 that may be raised and lowered by an elevational mechanism 114, such as a pneumatic or electromechanical lift with a vacuum sealed bellows. After the wafer is loaded into the chamber and placed on pins 110, the elevational mechanism 114 is lowered to place substrate 106 close to or onto a heated plate (or block) 116 for thermal processing. Alternatively, in one embodiment, the pins may be retracted below the top surface of the plate and the wafer may be supported at some small distance from the hot plate by standoffs. The standoffs are preferably made of very clean materials such as quartz or sapphire, and have smoothly radiused tips to prevent supporting the wafer on a sharp edge or point. Referring to FIG. 3, pins 110 may be surrounded by sleeves 310 to prevent gases containing trace contaminant metals in the vapor phase from flowing from cavity 320 (the cavity in which resistive heater 120A is located) in direction 330, thus depositing on the bottom surface of wafer 106. The sleeves may comprise clear quartz, opaque quarts, silicon carbide or other ceramic, and are clear quartz in one embodiment of the present invention.

The heated plate may have a large thermal mass that provides a stable and repeatable heat source for heating wafer 106. Preferably, heated block 116 provides a heating surface 118 within the chamber that is substantially parallel to the wafer to allow heat transfer across the entire backside surface area of the wafer. Heated block 116 comprises a material that will not contaminate wafer 106 to unacceptable levels even when the wafer is placed in contact with the heated block at high temperatures (greater than 500° C.) and moderate to low pressures (less than 100 Torr). In the first embodiment, heated plate 116 comprises silicon carbide coated graphite, although other materials that will not react with the wafer at processing temperatures such as silicon carbide or quartz may be used as well. A material with high thermal conductivity is preferred to allow heat to uniformly dissipate throughout the block. Insulating techniques described below are used to prevent sharp temperature gradients from forming in the heated block due to heat losses at the edges of the block.

The heated plate may be approximately one (1) inch thick in this embodiment, and provide a thermal mass substantially larger than the wafer having a thickness of approximately thirty five thousandths (0.035) of an inch. In this embodiment it is preferred that heated plate 116 be at least ten times thicker than the wafer that is being processed. This provides a stable temperature heat reservoir for thermally processing wafer 106.

In one embodiment, a single heated plate 116 extends across most of the chamber and provides a generally rectangular heating surface large enough to process two wafers at a time side-by-side with a spacing between the wafers that is approximately of the order of the wafer radius. The exposed regions proximate to which the wafers are processed are portions of the same heated plate. Using a single heated plate provides a simplified and cost effective design. The thermal processing chamber of the first embodiment provides exceptional processing uniformity even with a non-rotating design. In alternative embodiments, a separate rotating heating plate may be provided for each wafer to further enhance uniformity. The wafers could also be held slightly above the heated plate and rotated on pins. However, the chamber according to the first embodiment provides excellent uniformity without rotation, so a simplified and cost effective design is preferred.

Figure 4:
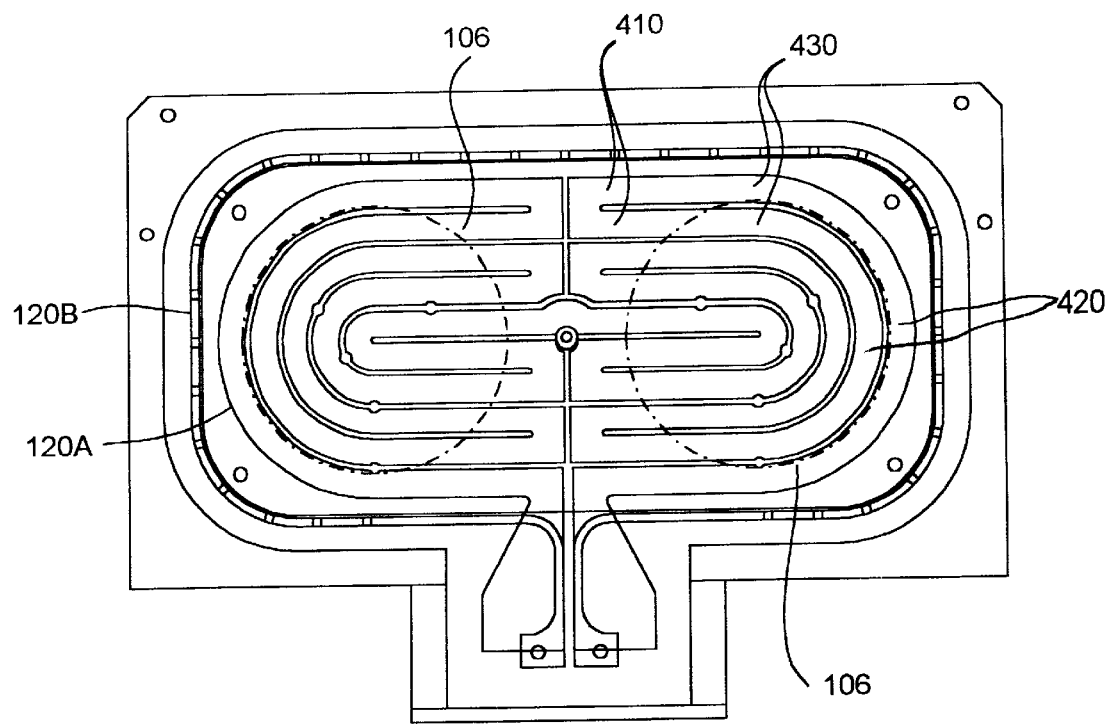
FIG. 4 is an exemplary base or primary heater.
Figure 5:
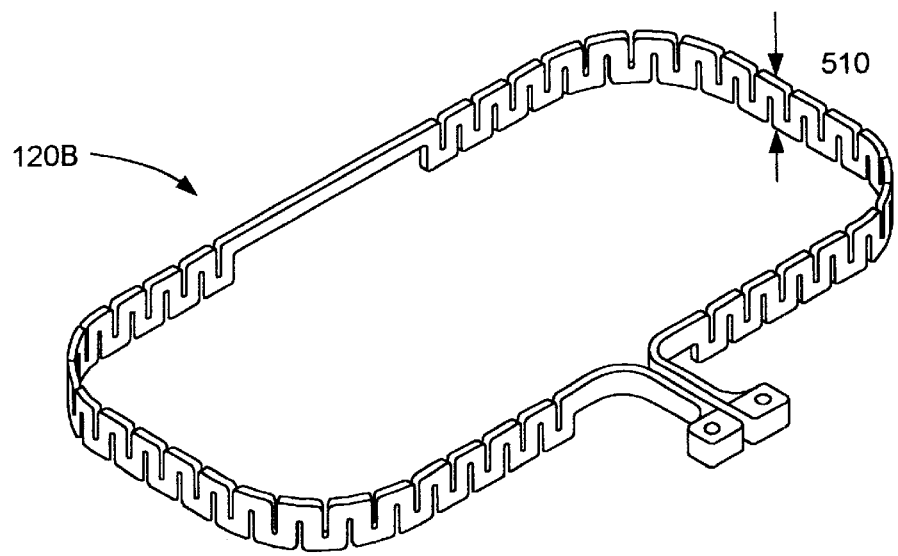
FIG. 5 is an exemplary edge or peripheral heater.

The heated block is heated by two resistive heaters 120A and 120B positioned below the heated block, and around its edges, respectively. A plan view of an exemplary heating element 120A surrounded by edge heater 120B is shown in FIG. 4. A three-dimensional schematic of an exemplary edge heater 120B is shown in FIG. 5. The heating element 120A may be thicker in regions 410 than in regions 420, and the heater thickness can go through a transition region at about location 430. Exemplary thicknesses at 410 and 420 are about 0.25 and 0.16 inches, respectively. The design of exemplary edge heater 120B, with the repeating S-shaped pattern shown in FIG. 5, is a result of manipulating the resistance of the heater to match the impedance of heater 120B to that of heater 120A: this allows the use of a common power supply (meaning that the same power supply may be used for both heaters). Although a solid strip could be used, the resistance of such a strip comprising similar materials might be lower, and the solid strip would therefore draw more current and require a dedicated power supply. The height of the edge heater (dimension 510 in FIG. 5) may range between about 0.2 and 2.0 inches, and any range subsumed therein, and is about 1.44 inches in one embodiment of the present invention. These resistive heaters preferably comprise silicon carbide coated graphite although other materials may also be used. U.S. patent application Ser. No. 08/499,986, which is incorporated herein by reference, describes additional aspects of a resistive heater system that may be used in conjunction with embodiments of the present invention.

Heater support posts (shown in FIGS. 2 and 6) space the resistive heater from heated block 116 by a short distance (approximately 0.125 inches). Power sources (not shown) are connected to the heaters by heater mounting mechanisms in a separate heater mounting chamber 142. Current is driven through resistive heaters 120A and 120B to heat the heated block 116, which in turn acts as a stable heat source for wafer 106. The power applied to the resistive heaters may be adjusted to control the temperature of the heated block. This is done using PID controllers which are separately responsible for each of the heaters.

Figure 6:
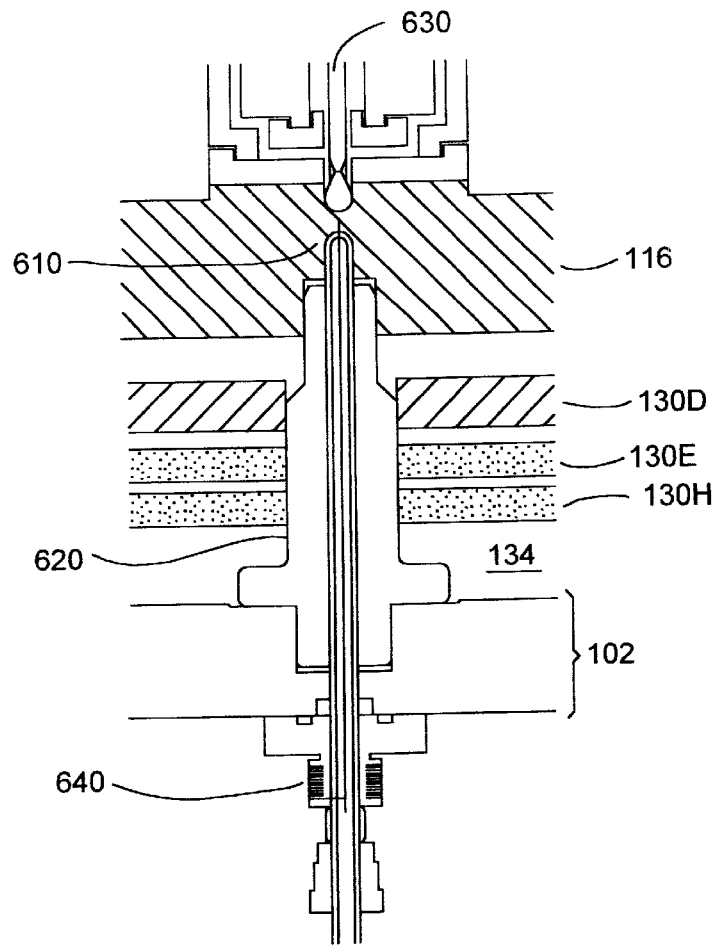
FIG. 6 is a side cross-section of a portion of an exemplary thermal processing chamber showing a thermocouple inside a support post; and an optical pyrometer opposing the tip of the thermocouple.

A thermocouple or other temperature sensor may be used to measure the temperature of the heated block, and may be used to provide calibration or temperature reference for optical pyrometers as well. An exemplary configuration is shown in FIG. 6, where thermocouple 610 is inserted through post 620 to terminate inside heated block 116 in opposition to optical pyrometer 630. The tip of the thermocouple may rest against a surface inside the heated block with a substantially constant force generated by the pressure differential between the inside and outside of the chamber, and a bellows 640 with a spring constant designed to partially resist the pressure differential. In one embodiment, the contact force is about 7 pounds. Optical pyrometer 630 may be inserted into a hollow ball of graphite that functions as a black body furnace. A known temperature gradient exists between through the heated block between the tip of the thermocouple and the end of the pyrometer, and this temperature gradient may be used to calibrate the pyrometer.

The pyrometers are used to measure instantaneous temperatures of the hot plate near its center and edge and to provide the primary data used to give appropriately offset values to the PID controllers. Such calibration is done reasonably often when there are no wafers in the processing chamber and the hot plate is controlled to a predetermined set-point temperature. An optical pyrometer or thermocouple may also be used to measure the wafer temperature directly, though this has difficulties such as determining the wafer emissivity. The temperature sensors send signals indicative of the temperatures including calculated offsets to each controller based on the temperature change of the hoods. The temperature control system then causes a transformer or other power source to apply an appropriate amount of power to the resistive heater to achieve the desired processing temperature. Typically temperatures between four hundred degrees C. (400° C.) and eleven hundred fifty degrees C. (1150° C.) are used for thermal processing in the chamber according to one embodiment.

Of course other mechanisms may be used to provide a stable heat source. For instance, an RF coil could be used to induce a current in a conductive plate within the chamber or lamps could be used to heat the backside of a conductive block. However, the resistive heaters and heated plate of this embodiment provide exceptionally stable and durable heat sources.

In order to reduce heat loss and enhance uniformity, heated block 116 and wafer 106 are enclosed within an insulated heating chamber 128. Heating chamber 128 is formed by insulating walls 130A–H spaced apart from heaters 120, heated block 116 and wafer 106. The outer insulating walls 130B and 130E–H preferably comprise materials that have a low thermal conductivity, which may be opaque quartz. In addition, such walls 130B and E–H may be highly reflective and substantially nontransmissive to thermal radiation (particularly in the visible and infrared regions). Thus, insulating walls 130B and E–H substantially prevent heat transfer by direct radiation from within heating chamber 128 to cold chamber walls 102. In the first embodiment, insulating walls 130B and E–H comprise opaque quartz with a thermal conductivity of approximately three and one half watts per centimeter Kelvin (3.5 W/cmK).

Opaque quartz is desirable because it is durable and inert in virtually all processes, has a high reflectivity and low conductivity, and may be used to form an insulating wall using a single intrinsic piece of material. Opaque Silica Glass OP-1 from Nippon Silica Glass U.S.A., Inc. is an exemplary opaque quartz that may be used in the first embodiment. In contrast to transparent quartz, opaque quartz is white with a nearly ideal opaque appearance. This is due to the special structure of the material which has a well-controlled distribution of micropores in the otherwise dense matrix, scattering light and thermal radiation in a very efficient and homogeneous way. Thus, the direct transmission of radiation is somewhat suppressed (less than 30% transmission across wavelengths from 200 to 5000 nm for 3 mm path length). The surface of the opaque quartz is preferably treated to inhibit flaking and the release of particulates. This is accomplished in the first embodiment by exposing the surfaces of the opaque quartz to high temperatures which glaze the surfaces. This forms a shallow layer (approximately 1 mm deep) of clear durable quartz on the exterior surfaces of the insulating walls which acts as a protective coating.

Of course, other heat resistant insulating materials, such as alumina and silicon carbide, could be used for the insulating walls. In addition, the insulating walls may be formed from a transmissive material such as clear quartz coated with a reflective material such as alumina, silicon carbide, or silicon nitride. However, these alternatives tend to be less durable than glazed opaque quartz, often flake and spall, and may interfere with the chemistry of some processes. Such walls could also be made from clear quartz or other good transparent thermal insulator within which a reflecting metal mirror was encased. Additional insulating walls may also be positioned between the heating chamber and chamber walls to improve insulation. In particular, the heating chamber may be enclosed within multiple insulating housings, which further may be made from materials such as opaque quartz or from materials such as graphite which has been coated with silicon carbide, with vacuum regions formed between the housings.

As shown in FIG. 1, three silicon carbide coated graphite pieces—a top 130A, side 130C, and base 130D are used to form heating chamber 128 in the first embodiment. The base 130D insulating wall is closely spaced to the heated block 116 and resistive heater 120. In one embodiment, the base 130D and side 130C insulating walls substantially encapsulates the heat source except for exposed circular regions of the heating surface which are shaped to receive the wafers. This helps channel the heat flux from the heat source through a circular region normal to the wafer surface and reduces lateral thermal gradients. In addition, the heating surface extends radially from the circular region underneath the side insulating wall 130C. This assists in isolating the wafer from any temperature drop off at the edge of the heated block.

Referring again to FIG. 1, the heated block forms shallow pockets, recessed areas in the block, or cavities for receiving the wafers in the circular regions that are left exposed by the base insulating wall 330D. The pockets are between one sixteenth (0.0625) and one eighth (0.125) of an inch deep in the first embodiment and may be flat, slightly concave with the center of the pocket being slightly lower (approximately 0.003 inches) than the perimeter of the pocket, or stepped with the center recessed relative to a ledge formed about the outer radius of the pocket. Recessed pockets help retain heat at the edges of the wafer and the pocket shape may affect temperature uniformity across the wafer surface. Outstanding process uniformities have been achieved at six hundred degrees C. (600° C.) and eight hundred degrees C. (800° C.) using both flat and recessed pocket designs.

The low pressure, insulating walls, and other thermal properties allow a very compact chamber design to be used with a high level of uniformity. In the first embodiment, the heated block 316 is approximately ten (10) inches wide which is only slightly wider than the wafer and its edges may be within one (1) inch of the cold chamber walls. The base insulating wall 330D is approximately five hundred thousandths (0.375) of an inch from the edge of heated block 316, having the peripheral heater between, and the distance from the base insulating wall to the chamber wall (across the insulating chamber 534) is less than half an inch. Thus, the width of the heated block is about eighty percent (80%) of the interior width of the processing chamber. In addition, the heated block occupies about ten percent (10%) of the interior volume of the processing chamber. Processing temperature uniformity may be achieved using this compact design even though the heated block may be heated in excess of one thousand degrees C. (1000° C.) and the chamber walls may be cooled to an average temperature of less than one hundred degrees C. (100° C.) with water or other cooling media. However, in order to maintain an acceptable level of uniformity, the chamber dimensions and materials and the processing parameters in the first embodiment are carefully selected to control heat transfer across heating chamber 328, through insulating walls 330A and 330C, and across insulating chamber 334.

Preferably the insulating walls have a thickness in the range of from twenty five hundredths (0.25) to one (1) inch although the thickness may be varied depending upon the thermal conductivity and transmission of the material. In the first embodiment, the top, side, and base insulating walls are approximately three hundred seventy five thousandths (0.375) of an inch thick and the bottom insulating wall (which is close to the graphite heater) is approximately six hundred twenty five thousandths (0.625) of an inch thick.

Figure 7:
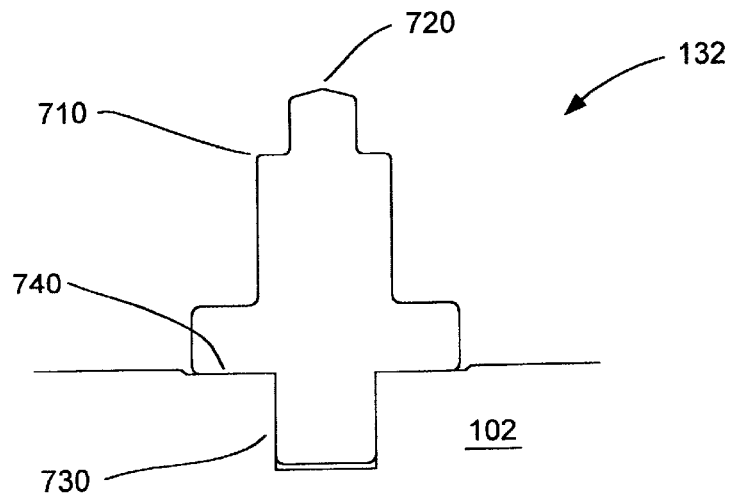
FIG. 7 is a cross-section of a support post.

The bottom insulating wall 130D is spaced from the chamber walls 102 by support leg or post 132; the post also serves to space insulating wall 130D from heater block 116. An exemplary support post is shown in more detail in FIGS. 2 and 7. Referring to FIGS. 2 and 7, insulating wall 130D may rest shoulder 710 of the post, and heated block 116 may rest on top region 720. A narrowed portion 730 of the post may fit into a recess of chamber 102, thus eliminating the need for fasteners at position 740 (and which may remove a potential source of contamination). Post 132 comprises an insulating material such as opaque quartz to minimize conductive heat transfer from the bottom insulating wall 130D to the chamber walls 102, While several support legs may be used, it is desirable to minimize the cross section of the thermally conductive path formed between the bottom insulating wall 130D and the bottom chamber wall by any support posts. In one embodiment, support post 132 has a relatively small cross section (substantially less than 10% of the surface area of the bottom insulating wall) to prevent a large conductive path from being formed between the insulating walls and the chamber walls.

The insulating walls 130A and 130C substantially enclose the heating chamber 128 and with 116 form an outer insulating chamber 134 between the insulating walls and the cold chamber walls. The insulating walls form an inner port 136 between the heating chamber 128 and insulating chamber 134 to allow a wafer to be inserted into the heating chamber. A shutter 141 may be used to cover the inner port 136 during processing to provide additional insulation. The shutter is shown covering the port at position 141A in FIG.

Figure 8:
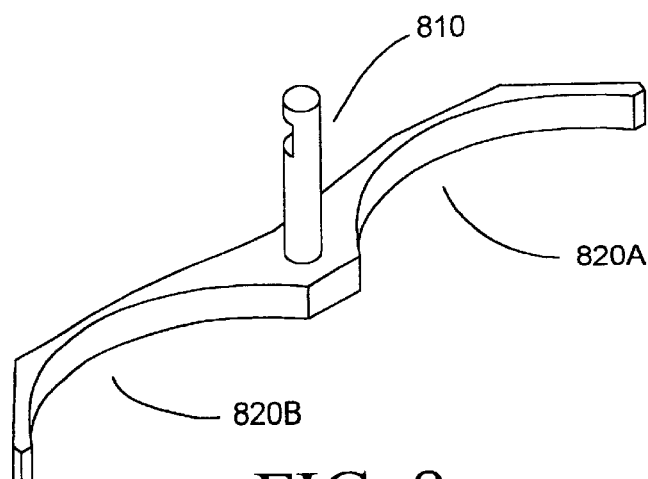
FIG. 8 is a three-dimensional view of a thermal insulating shutter.

1. The shutter is depicted in a raised position 141B (dotted lines in FIG. 1) to allow a wafer to be inserted and removed from the heating chamber. Shutter may comprise opaque quartz, clear quartz, silicon carbide, and other ceramics. A three-dimensional view of shutter 141 is shown in FIG. 8. The shutter may be supported by support rod 810, and regions 820A and 820B, the portions of the shutter that cover the ports and provide heat insulation, may be shaped to conform to that of a wafer.

Generally, heat is transferred in one embodiment from the heated plate 116, across the heating chamber 128 to the insulating walls 130A and 130C, through the insulating walls 130B and 130F, and across the insulating chamber 134 to the cold chamber walls 102, Of course, some heat may be transferred through support leg 132 by conduction and through inner port 136 by direct radiation (unless an opaque cover is used). However, a substantial majority (more than 60%) of the radiation from the heated block 116 is intercepted by the insulating walls 130A and 130C and only a small portion of the bottom insulating wall (less than 10%) is in contact with the support post. Thus, the rate of heat transfer in one embodiment is substantially dependent upon the thermal resistance across the heating chamber 128, through the insulating walls 130A and 130C, and across the insulating chamber 134.

In order to control heat transfer in the first embodiment, it is important to understand the mechanisms of heat transfer in these three regions. Heat may be transferred across the heating chamber and insulating chamber by conduction, radiation, and to a lesser degree by convection. Heat transfer through the insulating wall occurs primarily by conduction. The insulating wall is opaque so there is little if any radiative heat transfer, and since the insulating wall is solid, there are no convective currents.

Figure 9:
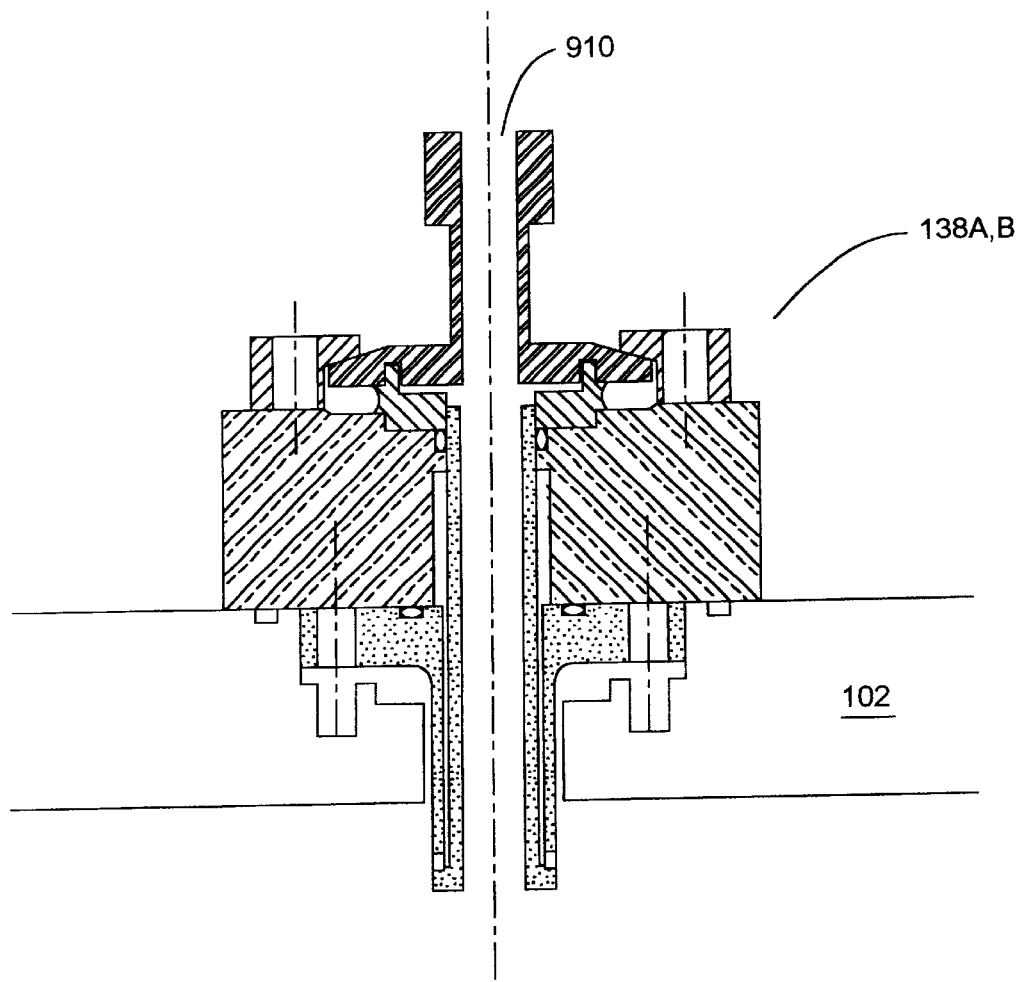
FIG. 9 is a cross-section of a gas injector having a port for an optical pyrometer.

The thermal resistance across the heating chamber and insulating chamber can be adjusted by adjusting the processing pressure. Referring to FIG. 2, gas inlets 138A and 138B provide a processing gas flow C2 to the wafer processing cavities, and gas inlet(s) 139 provides a purging gas flow C1 to the remainder of the reactor; specifically, to thermal insulating space 134. Gas inlets 138 and 139 are connected to conventional gas sources and mass flow controllers (not shown) to supply and regulate the flow of gas. Gas flow C2 is the actual processing gas. Purge gas C1 serves to prevent reaction byproducts and effluents from condensing on the optical pyrometers, chamber sidewalls, and other sensitive surfaces inside the chamber. In the event a gas injector 138A, 138B, or 139 is positioned over an area where a temperature measurement by optical pyrometry is desired, a port 910 (see FIG. 9) may be provided through the center of a gas injector for this purpose.

Referring again to FIG. 1, gas exhaust port 140 is connected to a conventional vacuum pump (not shown) which allows the pressure in the chamber to be controlled. In one embodiment, pressures from seven hundred sixty (760) Torr (atmospheric pressure) down to less than one tenth (0.1) of a Torr may be achieved. As will be described further below, pressures less than one hundred (100) Torr, and in particular pressures between two (2) Torr and fifty (50) Torr, are preferred in an embodiment of the present invention.

Figure 10:
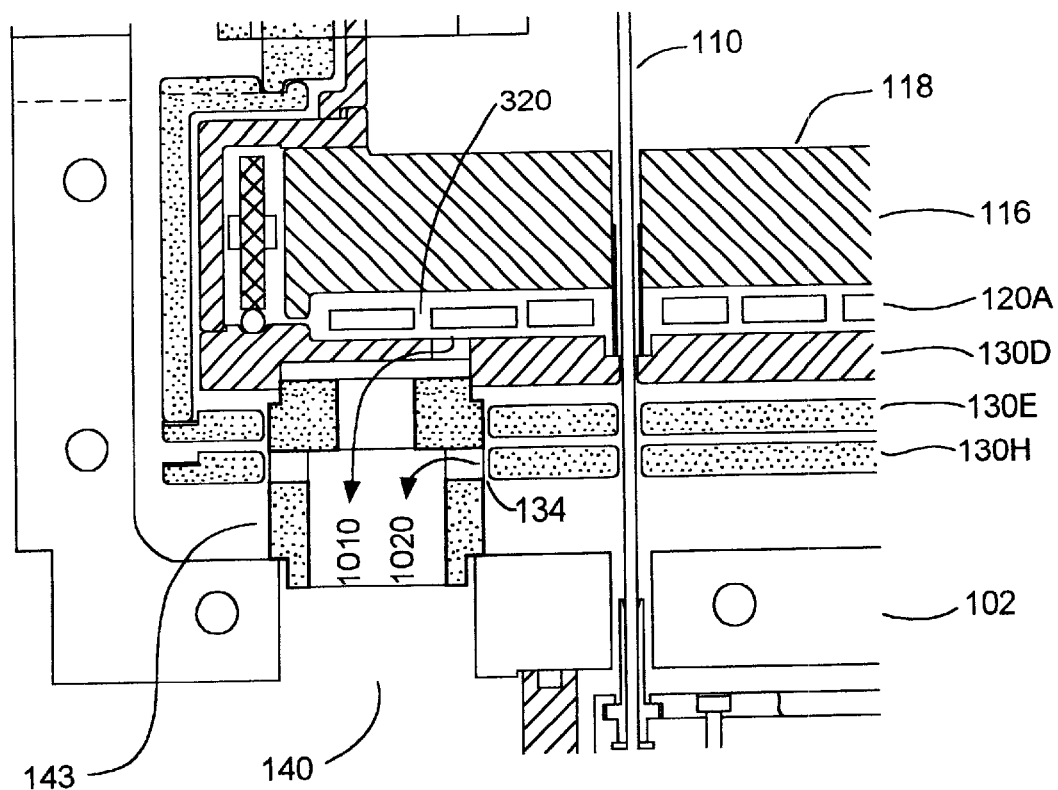
FIG. 10 is a side cross-section of a portion of an exemplary thermal processing chamber showing a vacuum spool in the foreline of an exhaust system.
Figure 11:
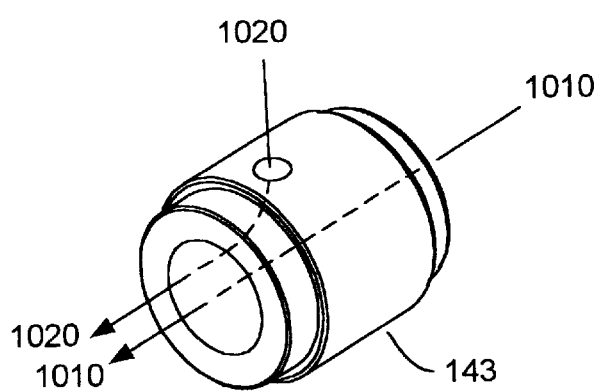
FIG. 11 is a three-dimensional view of a vacuum spool.

A pumping spool, or gas flow regulator 143 may be inserted into the exhaust port, as shown in FIGS. 1 and 10. The pumping spool is a baffle, or heat exchanger, positioned in the foreline of the exhaust pump, whose purpose is to keep the foreline (that portion of the exhaust system between the chamber and the pump) cold, so that, for example, the o-ring seals of the vacuum system are not damaged. The spool also serves to substantially prevent radiant heat from escaping the reaction chamber. Referring to FIG. 10, baffle 143 also serves to reduce the potential for contamination of substrates, particularly from trace metals in the vapor phase originating from the resistive heaters. This embodiment of the invention is accomplished by the design of spool which has a large conductance pathway 1010 for exhausting the region of the chamber containing the heaters, (region 320 in FIG. 10), and a small conductance pathway 1020 to exhaust other regions of the processing chamber not containing the heaters, or the balance of the chamber space, such as insulating space 134. A three-dimensional view of baffle 143 is shown in FIG. 11, with particular attention given to the smaller conductance pathway provided by exhaust 1020.

Aspects of the present invention include methods of using the thermal processing system. Two of the parameters that are obviously critical to these methods are the temperature and the pressure at which the processes are carried out. These methods may be applied to a variety of steps involved in the fabrication of integrated circuit devices, including (but not limited to): oxidation, nitridation, silicidation, anneals of BPSG and PSG; reflows and densification of glasses; implant anneals, copper anneals; and anneals of materials with low and high-dielectric constants. Silicidation steps may include the creation of a metal silicon compound $MSi_x$, where the M, the metal, includes Ti, Mo, Ta, and Co.

Wafer transfers are preferably performed at low pressures, such as about 2.0 Torr, so that defect densities resulting from particulate contamination may be minimized. Particulate contamination arises from, among other sources, the hardware used to transport wafers into the processing chamber. In some embodiments of the invention, the pressure at which the process is run determines whether the process comprises a one-step or multiple-step recipe. In general, the process will be one-step if the processing pressure is substantially equal to the load lock pressure. If the processing pressure is not equal to the load lock pressure, then a multiple step recipe may be necessary. Thermal processes that may occur at low pressures include contact and barrier metal silicidation.

In one embodiment of the invention, the process is one-step; the processing pressure is about 2 to 3 Torr; and the processing time is about 25 seconds to one minute. A nitrogen flow of about 500 sccm may be injected into the chamber C1 purge flow, and a processing gas flow C2 of about 1500 sccm (divided substantially equally between the two processing cavities) may be supplied as the processing gas. The processing gas may be nitrogen as well.

In thermal-budget sensitive applications such as the dopant anneal of an ultra-shallow shallow junction, a higher processing pressure is desirable in order to increase the rate of the temperature ramp to the processing temperature. An exemplary three-step process is shown in FIG. 12. In this example, the pressure in steps 1 and 3 (of about 2.5 Torr) corresponds to the pressure in the load lock as the substrate is being transferred into and out of the chamber, respectively. Step 2 is the processing step. The exemplary step 2 pressure in FIG. 12 is 35 sccm, but pressures of 10 and 50 Torr are also common. Typically, low pressure processing is common for silicidation reactions, and higher pressure processes are appropriate for source/drain junction dopant anneals (where uniformities are important). Load lock pressures may range from about 2 to about 100 Torr, and any range subsumed therein. Processing pressures may range from about 10 to about 760 Torr, or any range subsumed therein.

From the foregoing description, one skilled in the art can readily ascertain the essential characteristics of the present invention. The description is intended to be illustrative of the present invention and is not to be construed as a limitation or restriction thereon, the invention being delineated in the following claims.

We claim:

1. A thermal processor for processing a semiconductor substrate, the thermal processor comprising:

a processing chamber;

a primary heater and a peripheral heater spaced apart from the primary heater, the primary heater and the peripheral heater disposed within the processing chamber;

a heated block disposed within the processing chamber, the heated block spaced apart from the peripheral heater and receiving heat from the primary heater and the peripheral heater;

a set of insulating walls disposed within the processing chamber and substantially enclosing the primary heater, the peripheral heater, and the heated block, at least a portion of the insulating walls isolating the primary heater and the peripheral heater from exposure to the semiconductor substrate; and wherein the semiconductor substrate is placed adjacent the heated block to receive heat from the heated block during processing.

2. The thermal processor of claim 1 further comprising a power supply, wherein the peripheral heater has its impedance substantially matched to that of the primary heater such that a single power supply may be used to supply power to both the primary and the peripheral heaters.

3. The thermal processor of claim 1 wherein the primary heater and the peripheral heater are resistive heaters comprising silicon carbide coated graphite.

4. The thermal processor of claim 1 wherein the primary heater has at least a first region, a second region, and a transition region between the first and second regions, wherein the first region is substantially thicker than the second region.

5. The thermal processor of claim 1 wherein the peripheral heater has a repeating S-shaped pattern.

6. The thermal processor of claim 1 wherein the heated block(s) have a thermal mass substantially greater than that of the substrate.

7. A thermal processing system for processing a semiconductor substrate, the thermal processing system comprising:

a processing chamber;

a heater disposed within the processing chamber for heating the semiconductor substrate to a processing temperature;

a heated block disposed within the processing chamber, the heated block receiving heat from the heater;

an inner insulating wall disposed within the processing chamber, the inner insulating wall and a first portion of the heated block forming a heater cavity for substantially isolating the heater from the semiconductor substrate, and the inner insulating wall and a second portion of the heated block forming a processing cavity for processing the semiconductor substrate;

an outer insulating wall disposed within the processing chamber, the outer insulating wall substantially enclosing the inner insulating wall to form a vacuum region between the outer insulating wall and the inner insulating wall; and wherein a semiconductor substrate is placed adjacent the heated block to receive heat from the heated block during processing.

8. The thermal processing system of claim 7 wherein the inner set of insulating walls are substantially non-transmissive such that the inner set of insulating walls substantially prevent heat transfer by direct radiation from the heater block and the semiconductor substrate to the outer set of insulating walls.

9. The thermal processing system of claim 7 wherein the outer set of insulating walls are substantially non-transmissive such that the outer set of insulating walls substantially prevent heat transfer by direct radiation from the inner set of insulating walls to the chamber walls.

10. The thermal processing system of claim 7 wherein the outer set of insulating walls comprise a material with a thermal conductivity of about 3.5 W/cmK.

11. The thermal processing system of claim 7 wherein the outer set of insulating walls comprise opaque quartz.

12. The thermal processing system of claim 7 wherein the inner set of insulating walls comprise silicon carbide coated graphite.

13. A thermal processing system for processing a semiconductor substrate, the thermal processing system comprising:

a processing chamber;

a heater disposed within the processing chamber for heating the semiconductor substrate to a processing temperature;

a heated block disposed within the processing chamber, the heated block receiving heat from the heater;

an inner insulating wall disposed within the processing chamber and spaced apart from the heater block, the inner insulating wall substantially enclosing the heater and the semiconductor substrate;

an outer insulating wall disposed within the processing chamber, the outer insulating wall substantially enclosing the inner insulating wall;

wherein the inner insulating wall has an average temperature during processing that is less than the average temperature of the heated block; and wherein a semiconductor substrate is placed adjacent the heated block to receive heat from the heated block during processing.

14. A thermal processing system for processing a semiconductor substrate, the thermal processing system comprising:

a processing chamber;

a heater disposed within the processing chamber for heating the semiconductor substrate to a processing temperature;

a heated block disposed within the processing chamber, the heated block receiving heat from the heater;

an inner insulating wall disposed within the processing chamber and spaced apart from the heater block, the inner insulating wall substantially enclosing the heater and the semiconductor substrate;

an outer insulating wall disposed within the processing chamber, the outer insulating wall substantially enclosing the inner insulating wall;

wherein the outer insulating wall has an average temperature during processing that is less than the average temperature of the inner insulating wall; and wherein a semiconductor substrate is placed adjacent to the heated block to receive heat from the heated block during processing.

15. A thermal processing system for processing a semiconductor substrate, the thermal processing system comprising:

a processing chamber having a chamber wall;
a heater disposed within the processing chamber for heating the semiconductor substrate to a processing temperature;
a heated block disposed within the processing chamber, the heated block receiving heat from the heater;
an inner insulating wall disposed within the processing chamber and spaced apart from the heater block, the inner insulating wall substantially enclosing the heater and the semiconductor substrate;
an outer insulating wall disposed within the processing chamber, the outer insulating wall substantially enclosing the inner insulating wall;
wherein the chamber wall has an average temperature during processing that is less than the average temperature of the outer insulating wall; and
wherein a semiconductor substrate is placed adjacent to the heated block to receive heat from the heated block during processing.

16. The thermal processing system of claim 7 wherein the inner insulating walls during processing have an average temperature $T_{iw}$ and the heater block during processing has an average temperature $T_{hb}$, and wherein the difference between the average temperature of the heater block and the inner insulating walls $T_{hb}-T_{iw}$ is less than one half the average temperature of the heater block $T_{hb}$.

17. The thermal processor of claim 7 having one or more support posts for supporting the insulating layers and the heater block(s), and for spacing the insulating layers from the chamber wall and from the heater block(s).

18. A thermal processing system for processing a semiconductor substrate, the thermal processing system comprising:
a processing chamber;
a heater disposed within the processing chamber for heating the semiconductor substrate to a processing temperature;
a heated block disposed within the processing chamber, the heated block receiving heat from the heater;
an inner insulating wall disposed within the processing chamber and spaced apart from the heater block, the inner insulating wall substantially enclosing the heater and the semiconductor substrate;
an outer insulating wall disposed within the processing chamber, the outer insulating wall substantially enclosing the inner insulating wall;
one or more support posts for supporting the insulating layers and the heater block, and for spacing the insulating layers from the chamber wall and from the heater block;
wherein the support posts contain ports for a temperature sensor; and
wherein a semiconductor substrate is placed adjacent to the heated block to receive heat from the heated block during processing.

19. The thermal processor of claim 7 having one or more gas injectors wherein the gas injectors contain ports for a temperature sensor such as a thermocouple and an optical pyrometer.

20. A thermal processor for processing a semiconductor substrate, the thermal processor comprising:
a processing chamber;
a heater disposed within the processing chamber for heating the semiconductor substrate to a processing temperature;
a heated block disposed within the processing chamber, the heated block receiving heat from the primary heater;
an insulating wall disposed within the processing chamber and spaced apart from the heater block, wherein the insulating wall and a first portion of the heater block form a heater cavity for substantially isolating the heater from the semiconductor substrate, and wherein the insulating wall and a second portion of the heater block form a processing cavity for processing the semiconductor substrate;
a gas supply and an exhaust pump;
a gas flow controller between the heater cavity and the exhaust pump;
wherein the gas flow controller forms a first exhaust path and a second exhaust path, the first exhaust path primarily exhausting gas from the heater cavity, and the second exhaust path primarily exhausting gas from outside the heater cavity.

21. The thermal processing system of claim 20 wherein the gas flow controller reduces the temperature of the exhaust gases.

22. The thermal processing system of claim 20 wherein the gas flow controller reduces the potential for heat loss from the processing chamber.

23. A thermal processor for processing a semiconductor substrate, the thermal processor comprising:
a processing chamber;
a heater disposed within the processing chamber;
a heated block disposed within the processing chamber, the heated block receiving heat from the heater;
a gas supply and an exhaust port;
a thermocouple having a tip embedded within the heated block; and
an optical pyrometer also embedded within the heated block, and positioned such that it opposes the tip of the thermocouple.

24. The thermal processor of claim 23 wherein the thermocouple is used to calibrate the optical pyrometer.

25. The thermal processor of claim 1, wherein the set of insulating walls comprises an inner insulating wall and an outer insulating wall, the outer insulating wall surrounding the inner insulating wall to form a vacuum region between the outer insulating wall and the inner insulating wall.

26. The thermal processor of claim 25, further comprising an upper insulating plate disposed between an upper portion of the outer insulating wall and the chamber wall, and a lower insulating plate disposed between a lower portion of the outer insulating wall and the chamber wall.

27. The thermal processor of claim 1, further comprising a gas inlet port configured to inject a gas between the insulating walls and the chamber walls.

28. The thermal processor of claim 1, further comprising at least one lift pin disposed within the processing chamber for raising and lowering the semiconductor substrate relative to the heated block.

29. The thermal processor of claim 28, wherein the at least one lift pin passes through a sleeve disposed in the heated block to prevent exposure of the semiconductor substrate to the primary heater.

30. The thermal processing system of claim 7, further comprising an upper insulating plate disposed between an upper portion of the outer insulating wall and the chamber wall, and a lower insulating plate disposed between a lower portion of the outer insulating wall and the chamber wall.

31. The thermal processing system of claim 7, further including at least one lift pin disposed within the processing chamber for raising and lowering the semiconductor substrate relative to the heated block.

32. The thermal processing system of claim 31, wherein the at least one lift pin is surrounded by a sleeve to prevent a contaminant from flowing from the heated cavity to the processing cavity.

33. The thermal processing system of claim 17, wherein the one or more support posts comprises a first portion that supports the heated block and a second portion that supports an insulating wall.

34. The thermal processing system of claim 18, wherein the temperature sensor comprises at least one of a thermocouple and an optical pyrometer.

35. The thermal processor of claim 20, wherein the gas flow controller comprise a substantially cylindrical member having a first channel formed along an axis substantially parallel to the axis of the cylindrical member for exhausting gases via the first path, and a second channel formed along an axis substantially transverse to the axis of the cylindrical member for exhausting gases via the second path.

* * * * *